(12) United States Patent
Chang et al.

(10) Patent No.: US 6,412,101 B1
(45) Date of Patent: Jun. 25, 2002

(54) SIMULTANEOUS PATH OPTIMIZATION (SPO) SYSTEM AND METHOD

(75) Inventors: Norman H Chang, Fremont, CA (US); John D Wanek, Denver, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/327,987

(22) Filed: Jun. 8, 1999

(51) Int. Cl.[7] ............................................... G06F 17/50
(52) U.S. Cl. ................................... 716/10; 716/2; 716/6
(58) Field of Search ................................. 716/10, 11, 9, 716/8, 2, 6

(56) References Cited

U.S. PATENT DOCUMENTS

| | | | | | |
|---|---|---|---|---|---|
| 5,557,779 | A | * | 9/1996 | Minami | 395/500 |
| 5,838,580 | A | * | 11/1998 | Srivatsa | 364/489 |
| 5,883,808 | A | * | 3/1999 | Kawarabayashi | 364/488 |
| 5,974,245 | A | * | 10/1999 | Li et al. | 395/500.11 |
| 6,009,248 | A | * | 12/1999 | Sato et al. | 395/500.03 |
| 6,044,209 | A | * | 3/2000 | Alpert et al. | 395/500.07 |
| 6,117,182 | A | * | 9/2000 | Alpert et al. | 716/8 |
| 6,163,174 | A | * | 12/2000 | Friedman et al. | 326/108 |
| 6,202,192 | B1 | * | 3/2001 | Donath et al. | 716/6 |
| 6,205,570 | B1 | * | 3/2001 | Yamashita | 716/1 |

OTHER PUBLICATIONS

Jason Cong, "Modeling and Layout Optimization of VLSI Devices and Interconnects in Deep Submicron Design," IEEE, Jan. 1997, pp. 121–126.*

Jiang et al, "Combined Transistor sizing with buffer insertion for timing optimization," IEEE, May 1998, pp. 605–608.*

Tsai et al, "Performance Driven Bus Buffer Insertion," IEEE, Apr. 1996, pp. 429–437.*

Jiang et al, "Interleaving Buffer Insertion and Transistor Sizing into a Single Optimization," IEEE, Dec. 1998, pp. 625–633.*

* cited by examiner

Primary Examiner—Vuthe Siek

(57) ABSTRACT

A simultaneous path optimization (SPO) system determines where to insert repeaters within interconnects of an integrated circuit (IC) during the design of the interconnects in order to ultimately reduce signal propagation delays in the interconnects. The SPO system is designed as follows. A netlist of an electrical network is obtained. The netlist is simulated with a delay simulator to determine delays from a source to each sink. A slack parameter for each branch of the network is determined. The slack parameter is computed for each branch by subtracting a signal propagation delay associated the each branch from a timing constraint associated with each branch. The SPO system determines a main branch in the network as one of the branches that exhibits the largest one of the slack parameters. A total slack parameter is determined by adding the slack parameters. The SPO system determines how many of the repeaters, if any, should be inserted in side branches extending from the main branch by simulating repeaters in the side branches and determining whether the total slack parameter decreases by insertion of the repeaters. The SPO system determines how many repeaters, if any, should be inserted along the main branch using a delay simulator. Optionally, the SPO system may further determine how many more of the repeaters, if any, should be inserted in the side branches using a delay simulator. Finally, the SPO system outputs the repeater locations and connectivity.

68 Claims, 7 Drawing Sheets

SIMULTANEOUS PATH OPTIMIZATION (SPO) SYSTEM AND METHOD

FIELD OF THE INVENTION

The present invention generally relates to the design of electrical connections, or interconnects, situated within integrated circuits, and more particularly, to a simultaneous path optimization (SPO) system and method for automatically and efficiently determining where to insert repeaters (buffers or drivers) within interconnects of an integrated circuit during the design of the interconnects in order to ultimately reduce signal propagation delays in the interconnects.

BACKGROUND OF THE INVENTION

As operating frequencies increase to hundreds of megahertz (MHz) for multimedia processors and application specific integrated circuits (ASICs) and increase to around a gigahertz (GHz) for the next generation of central processing units (CPUs), the global electrical signals, for example, reset, stall, clock, and control, have less time to traverse an integrated circuit (IC) on a microchip (chip) due to reduced cycle time. The problem is compounded even further as IC chips get larger and larger. Therefore, global signals often exhibit larger than desirable propagation delays, and the circuits need to be optimized so that signals meet timing specifications.

Generally, the propagation delay associated with a signal, or the time necessary for the signal to propagate from one point to another on a chip, is caused by resistances and/or capacitances imposed upon the signal path, and is sometimes referred to as "RC delay." These resistances and capacitances also degrade the signal (decrease its rising/falling slope) as the signal propagates along a connection, which is another undesirable deleterious effect.

Many diverse approaches to this problem have been developed by researchers and published in the past few years. Consider the following, as examples: (1) N. Menezes, R. Baldick, and L. T. Pileggi, "A Sequential Quadratic Programming Approach to Concurrent Gate," Department of Electrical and Computer engineering, University of Texas at Austin, *ICCAD*, November 1995; (2) J. Lillis, C. K. Cheng, and T. T. Lin, "Optimal Wire Sizing and Buffer Insertion for Low Power and a Generalized Delay Model," University of California, San Diego, Calif., *ICCAD*, November 1996; (3) J. Cong, and C. K. Koh, "Simultaneous Driver and Wire Sizing for Performance and Power Optimization," University of California, Los Angeles, Calif., *IEEE, Transactions on Very Large Scale Integration Systems*, Vol. 2, No. 4, December 1994; and (4) L. P. Ginneken, "Buffer Placement in Distributed RC-tree Networks for Minimal Elmore Delay," IBM, NY, *IEEE International Symposium on Circuits and Systems*, 1990.

One effective technique in reducing the delay of a signal involves inserting a "repeater" (also referred to in the art as a "driver" or "buffer") along the signal path. A repeater is generally a circuit, for example, an inverter or set of cascaded inverters, that reduces the RC delay and slope degradation of the propagated signal. Historically, determining where to insert repeaters has been accomplished by creating and analyzing models of IC circuits. A mathematical algorithm known as "Elmore" has been used in the past to compute RC delays before and after introduction of repeaters in a circuit. The Elmore algorithm is described in detail in L. P. Ginneken, "Buffer Placement in Distributed RC-tree Networks for Minimal Elmore Delay," IBM, NY, *IEEE International Symposium on Circuits and Systems*, 1990.

However, this process is time consuming and has traditionally been performed by having an engineer or designer review circuit models and determine where to insert repeaters.

Software tools for modeling and simulating circuits are well known in the art. Well known delays simulators (or calculators) include, for example, SPICE, and OPTspice (available from Hewlett-Packard Company, U.S.A.). Although the foregoing software programs can be used for modeling and simulations, they do not automatically determine where and to what extent repeaters should be placed within a circuit.

Thus, a heretofore unaddressed need exists in the industry for a way to automatically and efficiently determine where to insert repeaters when designing an IC in order to reduce signal propagation delays in the IC.

SUMMARY OF THE INVENTION

A simultaneous path optimization (SPO) system (and associated method) automatically and efficiently determines where to insert repeaters (or buffers or drivers) within interconnects of an integrated circuit (IC) during the design of the interconnects in order to ultimately reduce signal propagation delays in the interconnects. The SPO system is implemented in software, hardware, or a combination thereof, but is preferably implemented as a software tool executed by a computer system that is used in connection with one or more conventional delay simulators (e.g., the SPICE program), also in the form of software that is executed by a computer system.

In architecture, the SPO system is designed as follows. The SPO system is designed to receive or obtain a description, or netlist, of an electrical network. The netlist indicates a source node, a plurality of sink nodes, a plurality of electrical branches connecting the source node with each the sink node, a plurality of resistances associated respectively with the branches, a plurality of capacitances associated respectively with the branches, and a plurality of timing constraints associated respectively with the branches. Each the timing constraint represents a maximum propagation time delay between the source and a respective one of the sinks.

The SPO system causes the netlist to be simulated using a delay simulator. Although not required to practice the present invention, the SPO system defines and utilizes a slack parameter. The SPO system determines a slack parameter for each branch of the network. The slack parameter is computed for each branch by mathematically combining (e.g., subtracting) a signal propagation delay associated the each branch and a timing constraint associated with each branch. The SPO system determines a main branch in the network as one of the branches that exhibits the largest one of the slack parameters. The SPO system produces a total slack parameter by mathematically combining (e.g., adding) the slack parameters. The SPO system determines how many of the repeaters, if any, should be inserted in at least one side branch extending from the main branch by simulating at least one repeater in at least one side branch and determining whether the total slack parameter decreases by insertion of the at least one repeater. The SPO system determines how many of the other repeaters, if any, should be inserted along the main branch using a first delay simulator and simulating at least one other repeater. The SPO system determines a position for each of the other repeaters using a second delay simulator and simulating the other repeaters. Finally, the SPO system outputs the repeater locations and connectivity.

The connectivity is generally a description as to what circuit elements each repeater is connected at its input and output ports.

Although not limited to this implementation, in the preferred embodiment, the aforementioned first delay simulator uses either a fast balanced segment delay process/system or an exhaustive search process, and the aforementioned second delay simulator uses a slower balanced segment delay process. In a sense, this overall process can be viewed as having a course adjustment part and a fine adjustment part, which achieves speedy and accurate results.

The invention may also be viewed as providing one or more methods for determining where to insert repeaters when designing an integrated circuit in order to reduce signal propagation delays in the integrated circuit. In this regard, one of the methods can be broadly summarized by the following steps: (a) obtaining a description of an electrical network; (b) determining a main branch in said network from said description based upon signal propagation delays associated with respective branches of said network; (c) simulating at least one repeater in at least one side branch extending from said main branch; (d) determining whether said at least one repeater should be inserted, where simulated, based upon said signal propagation delays associated with said branches; (e) simulating at least one other repeater along said main branch; and (f) determining whether said at least one other repeater should be inserted, where simulated, based upon said signal propagation delays associated with said branches. Furthermore, the method may further include the following additional steps: determining how many more of the repeaters, if any, should be inserted in the side branches via simulation of at least one more repeater in the side branches; and determining a position for each of the additional repeaters.

Another method involves a balanced segment delay method. In this regard, this method can be summarized by the following steps: A balanced segment delay method for optimizing speed associated with a branch of a circuit, comprising the steps of: (a) obtaining a description of a branch; (b) inserting a repeater in said branch to create a configuration having first and second segments of the branch that are connected to respective first and second ports of the repeater; (c) simulating the configuration to determine first and second segment delays for the first and second segments respectively and an overall branch delay for the branch; (d) storing the overall branch delay; (e) determining which direction the repeater will be moved along the branch based upon the first and second segment delays; (f) moving the repeater in the configuration to reduce the size of one of the first and second segments, while increasing the size of the other one of the first and second segments; (g) repeating steps (c) through (f) until the first and second segment delays are equal within a predefined threshold; and (h) selecting a particular one of the configurations that exhibits a lowest overall branch delay.

Other features and advantages of the present invention will become apparent to one with skill in the art upon examination of the following drawings and detailed description. These additional features and advantages are intended to be included herein within the scope of the present invention and protected by the claims set forth in the latter part of this document.

BRIEF DESCRIPTION OF THE DRAWINGS

The present invention can be understood with preference to the following drawing. The components of the drawings are not necessarily to scale relative to each other, emphasis instead being placed upon clearly illustrating principles of the invention. Furthermore, within the drawings, like reference numerals designate corresponding parts throughout the several views.

FIG. 4A is a schematic circuit diagram of the circuit to be optimized by the SPO system by adding repeaters, if appropriate;

FIG. 4B is a schematic circuit diagram of the circuit of FIG. 4A wherein repeaters have been added to some side branches by the SPO system;

FIG. 4C is a schematic circuit diagram of the circuit of FIGS. 4A and 4B wherein repeaters have been added to segments (between side branches) of a main branch (critical path having the longest delay) by the SPO system;

FIG. 4D is a schematic circuit diagram of the circuit of FIGS. 4A through 4C wherein more repeaters have been added to some of the side branches by the SPO system;

DETAILED DESCRIPTION OF THE PREFERRED EMBODIMENT

The simultaneous path optimization (SPO) system and method of the present invention can be implemented in software, firmware, hardware, or a combination thereof. In the preferred embodiment, which is intended to be a non-limiting example, the SPO system 10 is implemented in software that is executed by a computer, for example, but not limited to, a personal computer, workstation, minicomputer, or mainframe computer.

In this preferred embodiment, the software-based SPO system, which comprises an ordered listing of executable instructions for implementing logical functions (like any software program), can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
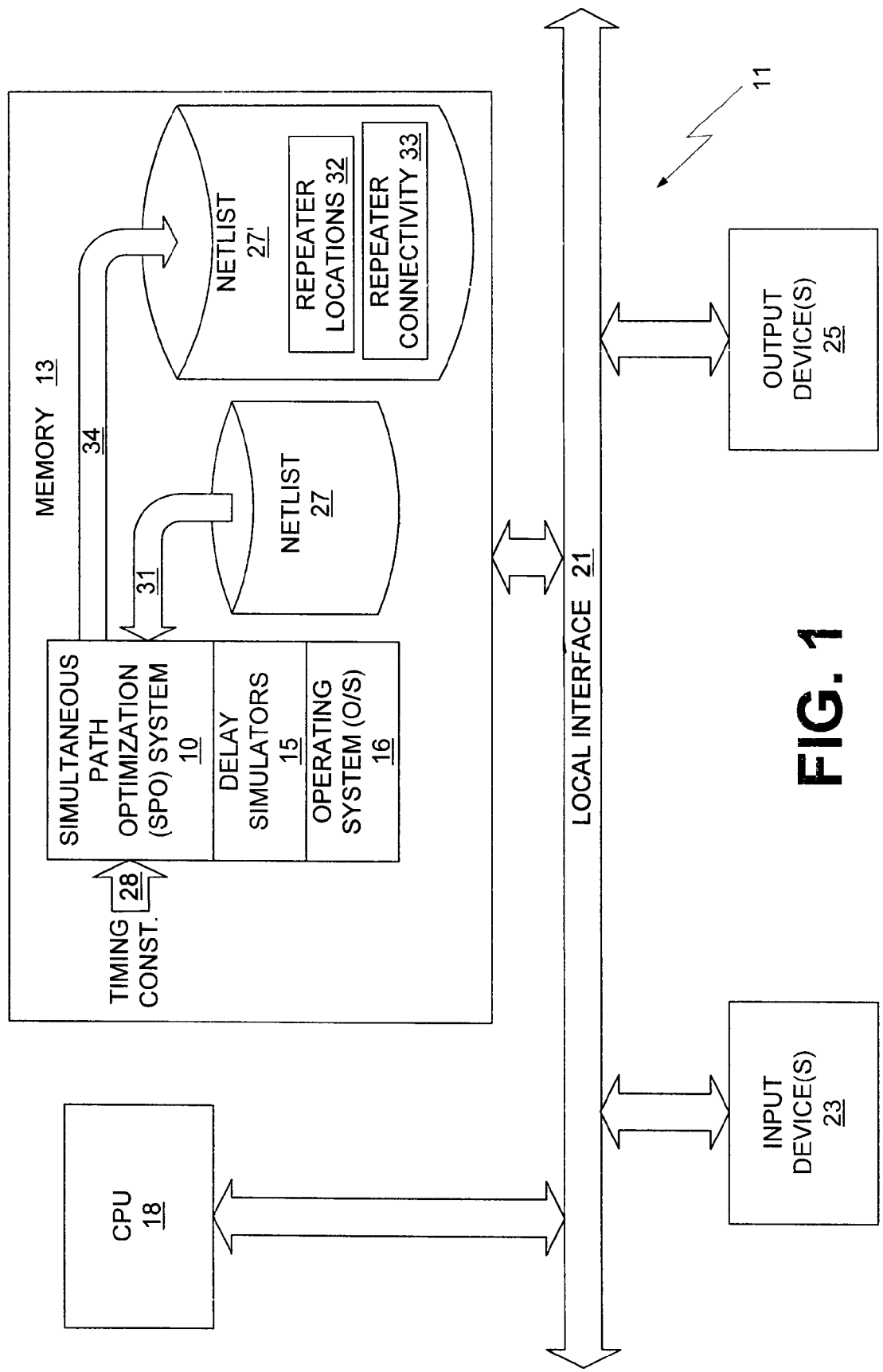
FIG. 1 is a block diagram of a computer implementing the simultaneous path optimization (SPO) system and method of the present invention.

By way of example and illustration, FIG. 1 is a block diagram of a workstation computer 11 that can be used to implement the software-based SPO system 10 of the invention. With reference to FIG. 1, architecturally, the computer 11 includes a memory 13 (volatile storage (e.g., RAM) and/or nonvolatile storage (e.g., ROM); typically a collection of the foregoing) having the SPO system 10 stored therein and configured to be executed. The SPO system 10 operates in conjunction with software-based delay simulator 15 and an operating system 16, for example, UNIX or WINDOWS, which are also stored in the memory 13. A central processing unit (CPU) 18, preferably a conventional commercially available microprocessor, accesses and executes the programs 10, 15, 16 via a local interface 21, for example, one or more buses. Optionally, one or more input devices 23 (e.g., a keyboard, mouse, etc.) configure and/or provide input to the system 11 via the local interface 21. Optionally, one or more output devices 25 (e.g., a display device, printer, network interface, etc.) provide data to another entity, system, apparatus, or user from the computer 11 via the local interface 21.

A netlist 27 is provided to the SPO system 10. The netlist 27 is essentially a software file having a description, or model, of an integrated circuit indicating the various branches, or signal paths, or interconnects, of the circuit (for example, in terms of x,y coordinates for each node), resistances and capacitances associated with the branches, and repeater/buffer/driver specification (e.g., width(s), length(s), ratio, etc.). The netlist 27 may be derived by any suitable means, even manually, although this is not preferred. As an example of automated means, the netlist 27 may be produced with artwork resistance/capacitance (RC) extraction software, for example but not limited to, the Arcadia program manufactured by and commercially available from Cadence Design Systems, Inc., U.S.A. As another example, the netlist 27 may be produced by estimation of RC values based on per-unit R and C for the IC process and signal path information from commercially available routing software, for example but not limited to, the Cell3 routing program, which is available from Cadence, or IC Craftman routing program, which is available from Cooper & Chang, Inc., U.S.A.

The netlist 27 is stored or provided to the SPO system 10 in the memory 13. When initiated, the SPO system 10 analyzes and processes the netlist 27 (as well as timing constraints 28 that are either preset or input by a user, but are preferably input) in the memory 13 in order to determine where to insert and simulate repeaters 64 (see FIGS. 4A through 4D) within the integrated circuit modeled by the netlist 27 for the purpose of ultimately reducing signal propagation delays in the integrated circuit. After processing the netlist 27, the SPO system 10 outputs a new netlist 27' having repeater locations 32 and connectivity 33 therein, the latter of which identifies what the repeaters are connected to. Hence, the SPO system 10 automatically and efficiently determines where to insert repeaters 64 in the integrated circuit defined by the netlist 27 in order to optimize the circuit defined by the netlist by ultimately reducing signal propagation delays therein.

Although obviously not limited to these types of circuits, in the preferred embodiment, the circuits to be optimized are those that employ complementary-metal-oxide-semiconductor-field-effect transistors (CMOSFETs). Therefore, the repeaters 64 are preferably CMOSFET inverters, which have a p-type MOSFET connected with an n-type MOSFET, as is well known in the art. A single inverter or cascaded set of inverters is utilized as each repeater 64. The repeaters 64, in general, reduce the signal propagation delay imposed by the RC characteristics and reduces slope degradation of propagated signals in the CMOSFET circuits. Many other types of buffers or drivers could be employed as repeaters 64.

Figure 2:
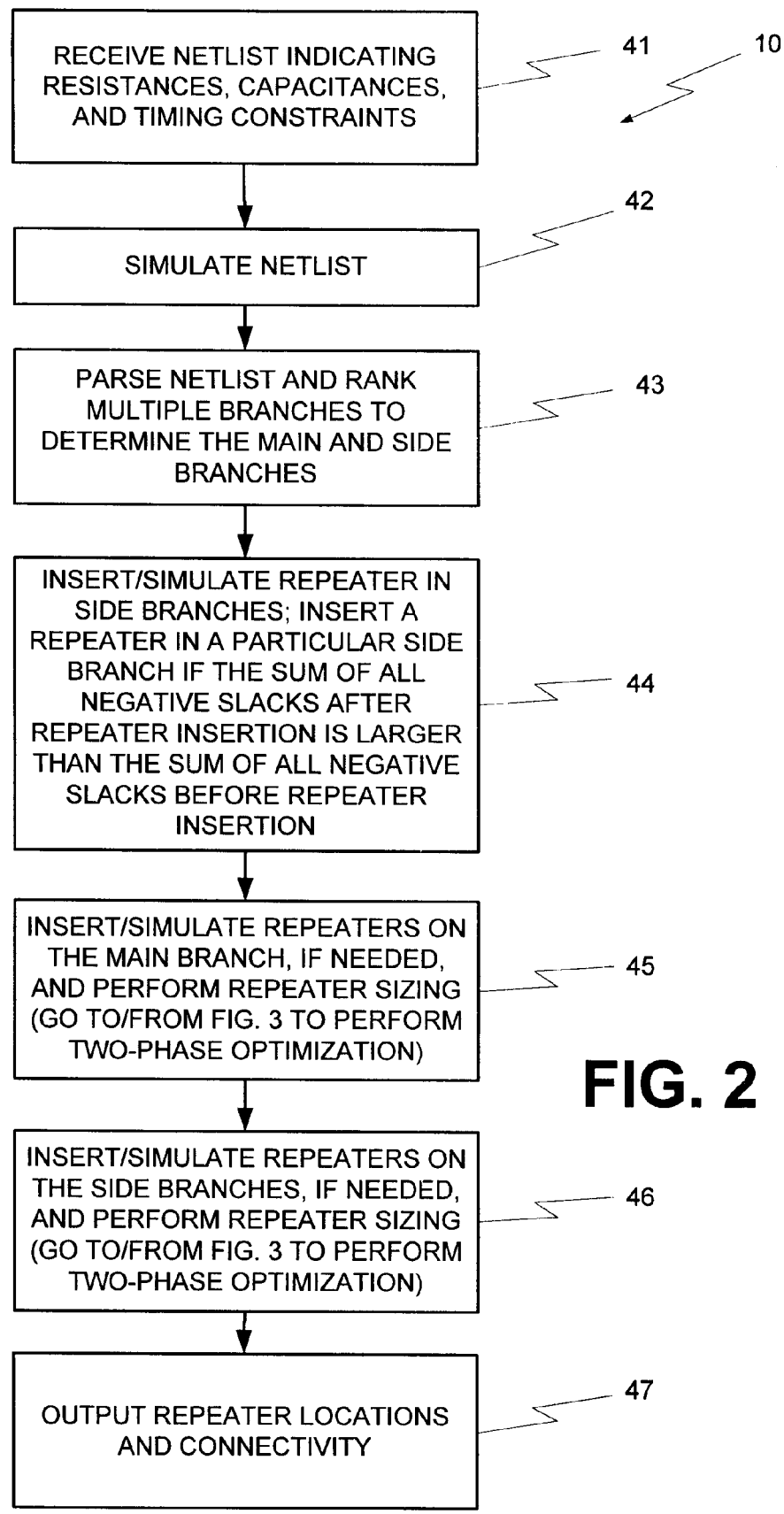
FIG. 2 is a flow chart showing the architecture, functionality, and operation of a possible implementation of the SPO system of FIG. 1.

FIG. 2 is a flow chart illustrating the architecture, functionality, and operation of a possible implementation (nonlimiting example) of the SPO system 10 (FIG. 1) of the present invention. In regard to this flow chart (as well as that shown in FIG. 3), each block represents a module, segment, or portion of code, which comprises one or more executable instructions for implementing the specified logical function (s). It should also be noted that in some alternative implementations, the functions noted in the blocks may occur out of the order noted. For example, two blocks shown in succession may in fact be executed substantially concurrently or the blocks may sometimes be executed in the reverse order, depending upon the functionality involved.

Referring to FIG. 2, as indicated at a block 41, the SPO system 10 is configured to receive and/or retrieve a netlist 27, which, as mentioned, is generally the description of an electrical network(s). The netlist 27 defines an electrical network and includes resistances, capacitances, and timing constraints of the network, among other possible parameters. In the preferred embodiment, the netlist 27 indicates and defines at least the following information in an orthogonal x,y coordinate system: a source node, a plurality of sink nodes, a plurality of electrical branches connecting the source node with each sink node, a plurality of resistance associated respectively with the branches, a plurality of capacitances associated respectively with the branches, a plurality of timing constraints 28 (FIG. 1) associated respectively with the sinks, and a repeater specification (in the preferred embodiment, the length of each CMOSFET inverter and PFET to NFET ratio, so that the widths of each PFET and NFET can be readily derived by multiplying the ratio (or inverse) and length). Each timing constraint 28 represents a maximum propagation time delay between the source and a respective one of the sinks. The timing constraints 28 are preset or are input by a user, for example, via any suitable input device 23 (FIG. 1).

The netlist 27 is simulated, as indicated at block 42. The netlist 27 is simulated using any suitable simulator 15 (FIG. 1), for example but not limited to, SPICE, OPTspice, etc., in order to determine the actual delay from the source to each respective sink of the network.

Figure 4A:
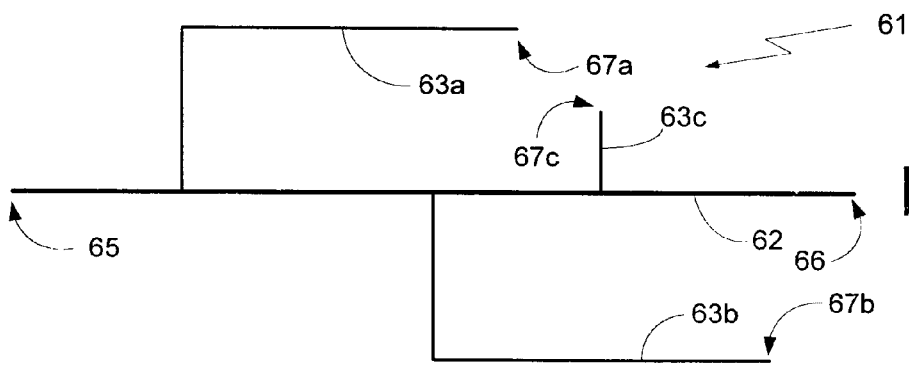
FIGS. 4A through 4D are schematic circuit diagrams of an example of a circuit as the circuit is successively analyzed, simulated, and modified by the SPO system of FIG. 1 pursuant to the methodology of FIGS. 2 and 3.
Figure 4B:
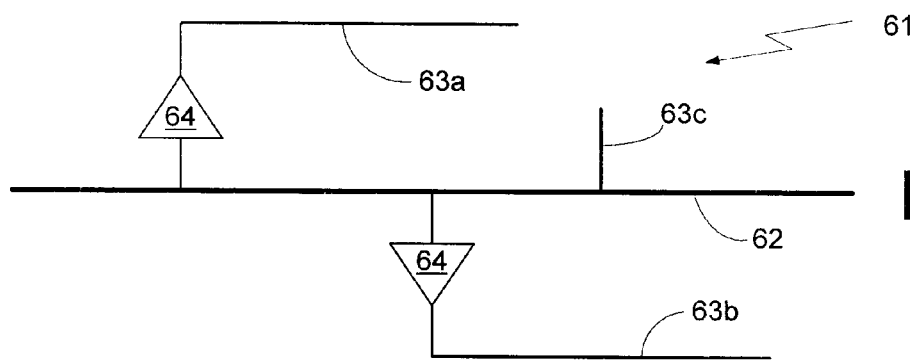
Figure 4C:
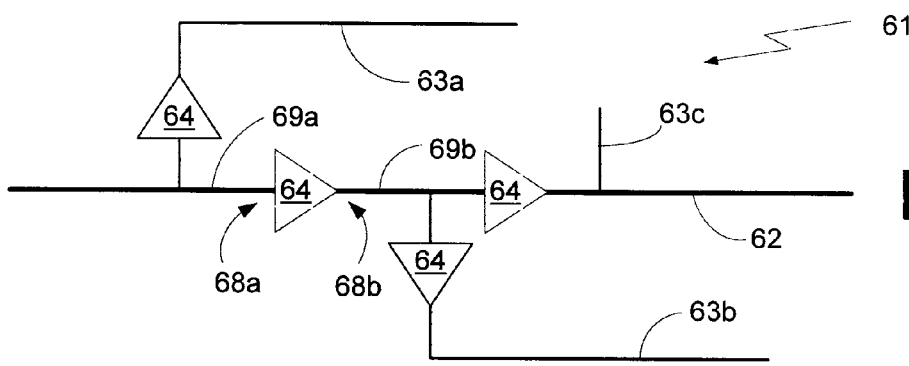

As indicated at block 43, next, a connection matrix is generated with all the nodes that are identified in the input file. The timing constraints are parsed from the netlist 27, and a list of all the nodes from the source to the sink nodes are generated. In general, there is usually a most critical source-to-sink branch, or main branch, that requires the greatest optimization. Therefore, the source-to-sink delays of all the branches are ranged according to a corresponding slack parameter. The slack parameter is defined herein to be the difference between the timing specification and the actual delay from the source to each sink. With sorting of the slack parameters in ascending order, a main branch is defined as the one with the greatest slack parameter value (in the preferred embodiment, the most negative value, although it could be the most positive in other implementations) relative to its timing constraint. The other source-to-sink branches are treated as side branches. FIGS. 4A through 4D graphically illustrate a circuit 61 to be optimized, as an example. As shown in FIG. 4A, the circuit 61 has a main branch 62 spanning between a source node 65 and a sink node 66 and has a plurality of side branches 63a–63c, each spanning from the main branch 62 to a respective sink node 67a–67c. In this example, the main branch 62 has the most negative slack parameter, or in other words, the largest signal propagation delay, as simulated, as compared to the other branches.

With reference to block 44 of FIG. 2, the SPO system 10 next begins a process of inserting repeaters 64, if appropriate, in side branches 63. Generally, a repeater 64 is inserted into a particular side branch 63, at a position at or in close proximity of the point where the side branch originates from the main branch 62, and then the circuit 61 is simulated using one of the delay simulators 15 (FIG. 1), preferably the SPICE program, to determine whether or not the repeater 64 should be added, or inserted. Inserting a repeaters 64 has the effect of shielding the main branch 62 from the capacitance associated with the side branch 63. If the capacitance of the side branch 63 is greater than the input capacitance of the side branch 63, then the delay of the main branch 62 will decrease. The delay of the side branch may increase with the insertion of the side branch repeater if the branch is relatively short. This is taken into account when all of the slack parameters are mathematically combined (preferably, added up).

Pursuant to the preferred methodology, a repeater 64 is inserted into the particular side branch 63 if the sum of all negative slack parameters after repeater insertion is larger than the sum of all negative slack parameters before repeater insertion. As shown graphically in the example of FIGS. 4A through 4D, particularly at FIG. 4B, repeaters 64 are added to side branches 63a and 63b, but not side branch 63c. The reason is that the insertion and simulation of a repeaters 64 along the short side branch 63c did not significantly improve, if at all, the overall signal propagation delay (because of its short length), and therefore, it was concluded by the SPO system 10 that a repeater 64 should not be inserted into the side branch 63c.

Figure 3:
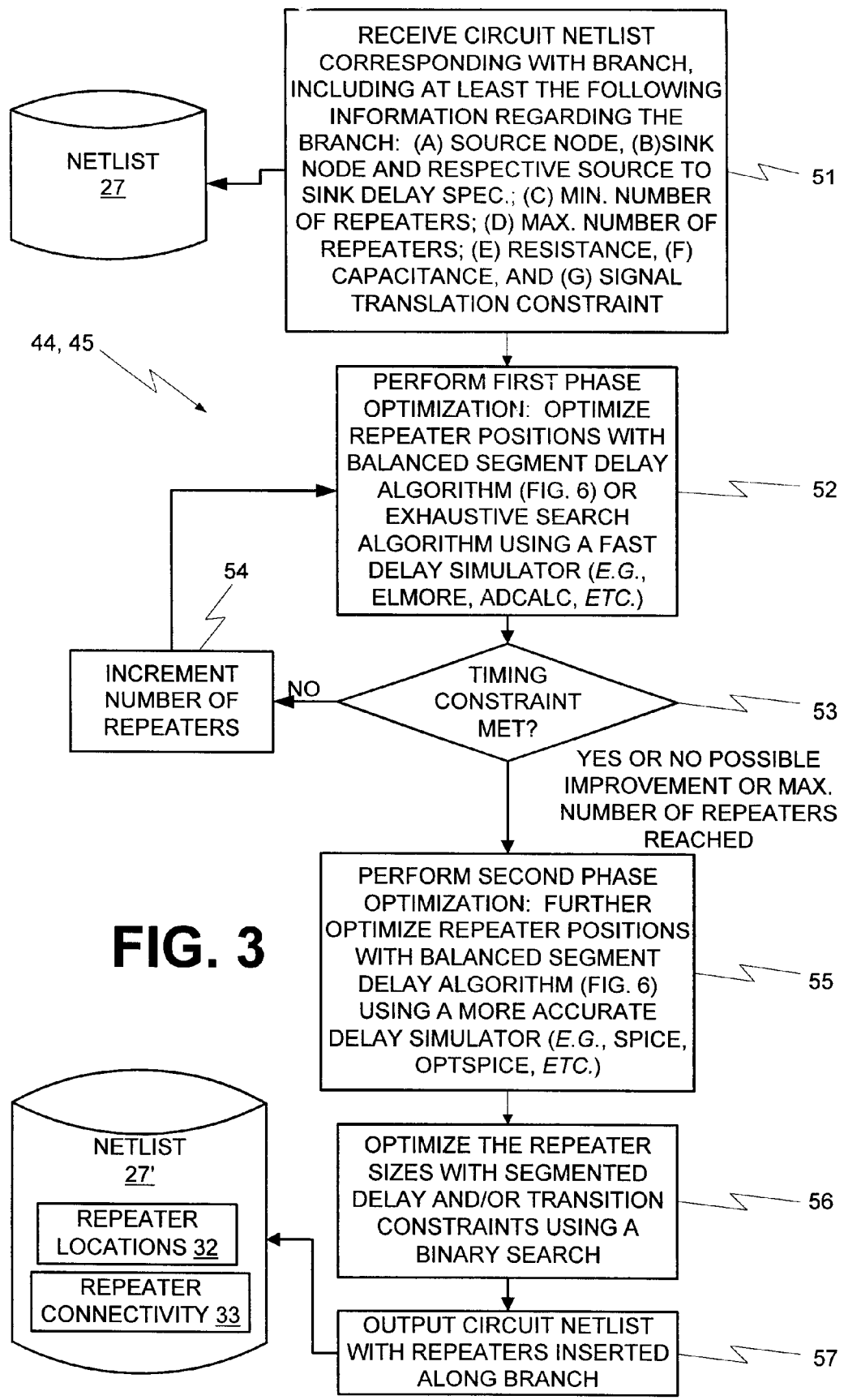
FIG. 3 is a flow chart showing the architecture, functionality, and operation of a possible implementation of the insert/simulate repeater process referenced in the flow chart of FIG. 2.
Figure 6:
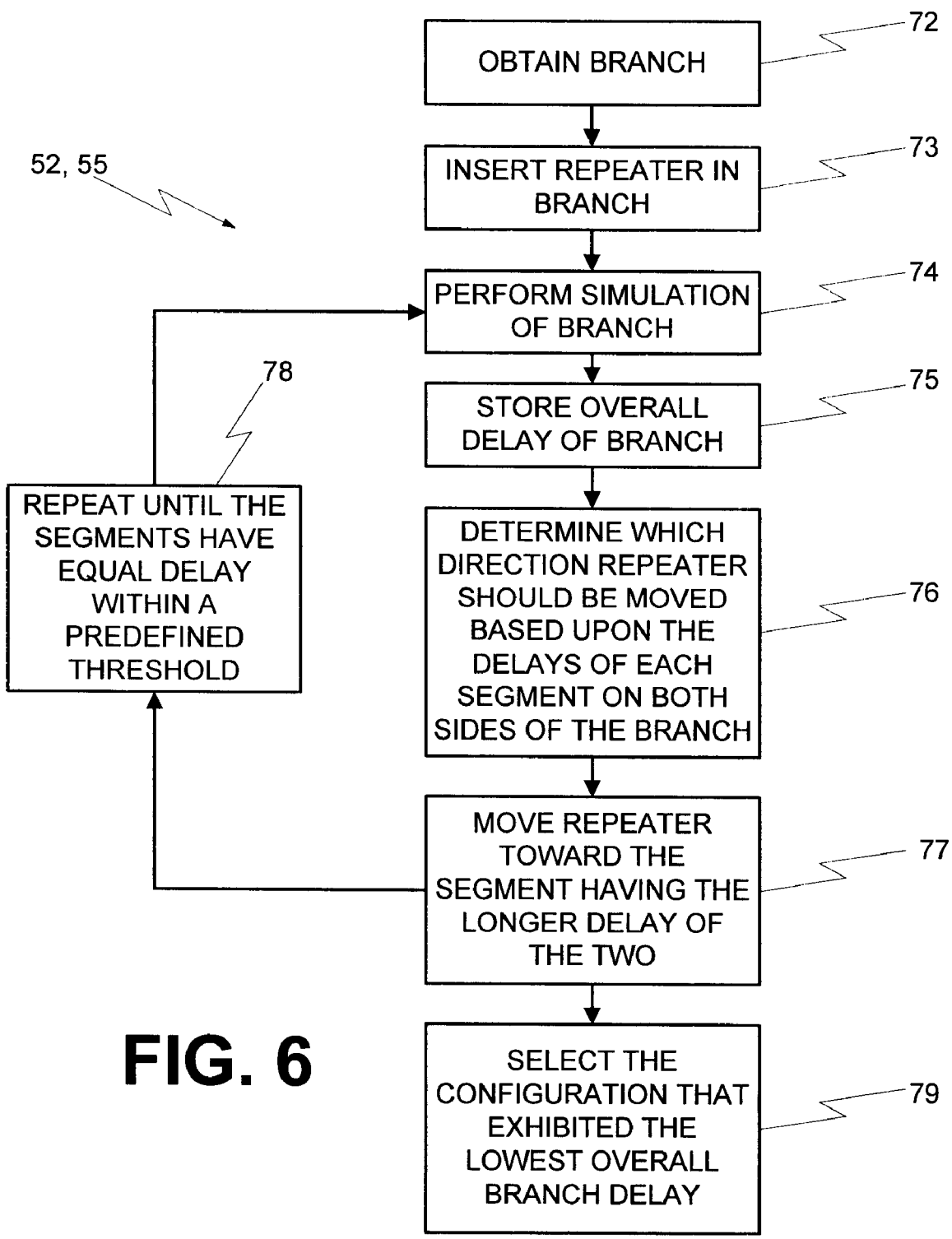
FIG. 6 is a flow chart showing the architecture, functionality, and operation of a possible implementation of a balanced segment delay algorithm referenced in FIG. 3.

Next, as denoted at block 45, the SPO system 10 analyzes the netlist 27 in order to determine whether to insert any repeaters 64 along the main branch 62. Once the side branch repeaters 64 have been placed, the main branch is then considered as a point-to-point path from source to sink, and the side branches are ignored. Repeaters 64 can be placed at any point along the path of the main branch. The process for accomplishing this is set forth in FIG. 3 and will be described in detail hereinafter upon completion of the description of FIG. 2. In general, the process shown in FIG. 3 is a two-phase process involving insertion of a repeater 64 at a position using a fast simulator 15 and then readjustment of the position using a slower, more accurate simulator 15. As shown graphically in the example of FIGS. 4A through 4D, particularly at FIG. 4C, two repeaters 64 are added to two successive parts of the main branch 62, between side branches 63a and 63b and between side branches 63b and 63c, respectively. Each inserted repeater 64 has first and second ports 68a, 68b and creates first and second segments 69a, 69b upon insertion into a branch, which are at issue in connection with the balanced segment delay algorithm (FIG. 6). In essence, the lengths of segments 69a, 69b are adjusted by the foregoing algorithm, in accordance with the present invention.

Figure 4D:
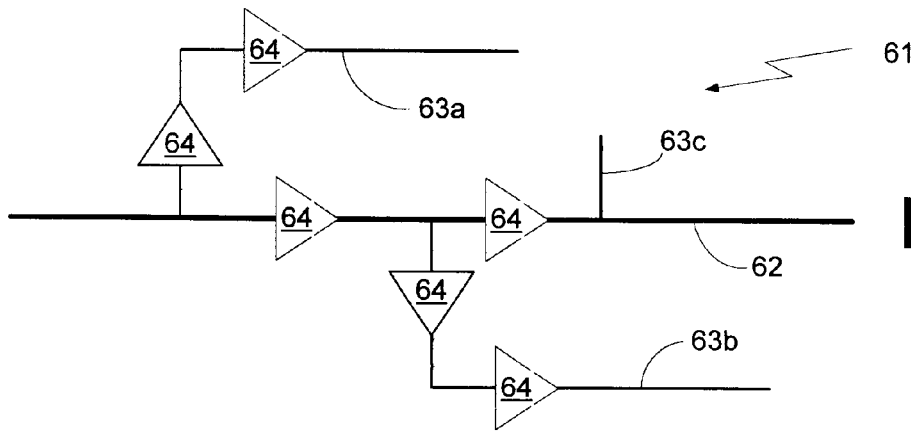

Next, as indicated at block 46 in FIG. 2, the SPO system 10 determines whether to insert one or more repeaters 64 on each of the side branches 63, in accordance with further simulations and the process defined in FIG. 3, in order to further minimize delays from the source to each sink. Each side branch is considered as a point-to-point path from the output of the side branch repeaters 64 to the corresponding sink. Repeaters 64 can be placed at any position along this defined path. FIG. 4D shows graphically insertion of repeaters 64 on side branches 63a and 63b, as an example. These further repeaters 64 are added to further optimize the side branch delays. After these repeaters 64 are inserted into each side branch 63, the resulting set of repeaters 64 can be optimized (i.e., reduced) in size to save power and area, while still meeting the specified delay constraints.

As denoted at block 47, the SPO system 10 outputs the new netlist 27' having repeater locations 32 and the connectivity 33. In the preferred embodiment, the repeater locations 32 are defined by x,y coordinates, and the connectivity 33 is a description of how the input and how the output of the inserted repeaters are connected, i.e., an identification of which resister or capacitor each input and output are connected to.

Figure 7:
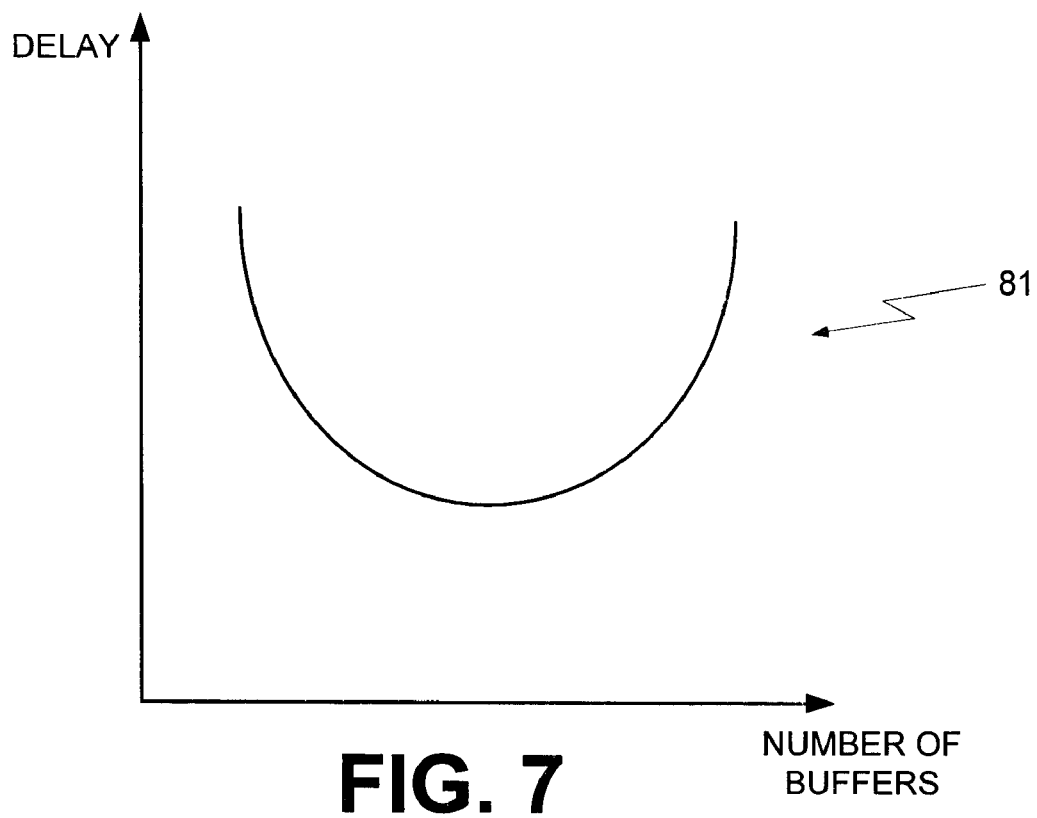
FIG. 7 is a graph showing the effect of the number of repeaters in a circuit branch on the signal propagation delay associated with the branch.

FIG. 3 is a flow chart illustrating the architecture, functionality, and operation of the optimization process being performed at blocks 44 and 45 of FIG. 2. Each optimization (implemented at either block 44 or 45) is performed in two phases. In the first phase, a fast initial optimization is performed to quickly find the number and approximate position of repeaters 64. This initial phase uses fast delay calculators and a SPICE run to simulate accurate delays at the end of each iteration. In the second phase, SPICE program is used to fine tune the position of repeaters 64 given the number and approximate positions of the repeaters 64 from the first phase. A graph of the delay versus number of repeaters 64 (with fixed size) in optimum locations exhibits a U-shaped curve 81 as shown in FIG. 7. The goal is therefore to find the optimum number of repeaters 64 and their locations.

More specifically, with reference to FIG. 3, at block 51, the SPO system 10 receives or retrieves the part of the netlist 27 defining in x,y coordinates the circuit branch 62, 63 (FIG. 4) at issue and at least the following information: a source node, a sink node, source to sink delay specification, resistance associated with the branch, capacitance associated with the branch, and a timing constraint (input by the user).

Next, at block 52, the first phase optimization process is performed. This process may be performed using either a balanced segment delay algorithm or an exhaustive search algorithm, along with a fast delay simulator 15 (FIG. 1), for example but not limited to, the Elmore delay program. The first approach, the balanced segment delay algorithm (example implementation in FIG. 6), is based on the assumption that the minimized delay occurs at or near the balanced segment delay positions on the circuit path. A segment delay is defined to be the delay from the output of a repeater 64 or the initial input repeater to the input of the next repeater 64. The algorithm's premise is obviously true when an interconnect path under optimization has the same width/spacing along the path. The delay for a uniform interconnect with a repeater 64 inserted can be represented as a mathematical quadratic function of unit capacitance (c), resistance (r), and length (L) as in Eq. (1) hereafter, where A and C are constants:

$$\text{Delay}_x = A \cdot r \cdot c \cdot x^2 + A \cdot r \cdot c \cdot (L-x)^2 + C \qquad \text{Eq. 1}$$

If the derivative of Eq. 1 is equated to zero and solved, then the position of a repeater 64 that minimizes the total delay can be determined. The solution is 0.5*L, which is the midpoint of the uniform interconnect with length L. This is also true for more than one repeater 64 inserted in a uniform path that the positions of inserted repeaters 64 are uniformly spread along the path to achieve the minimum total delay.

Figure 5:
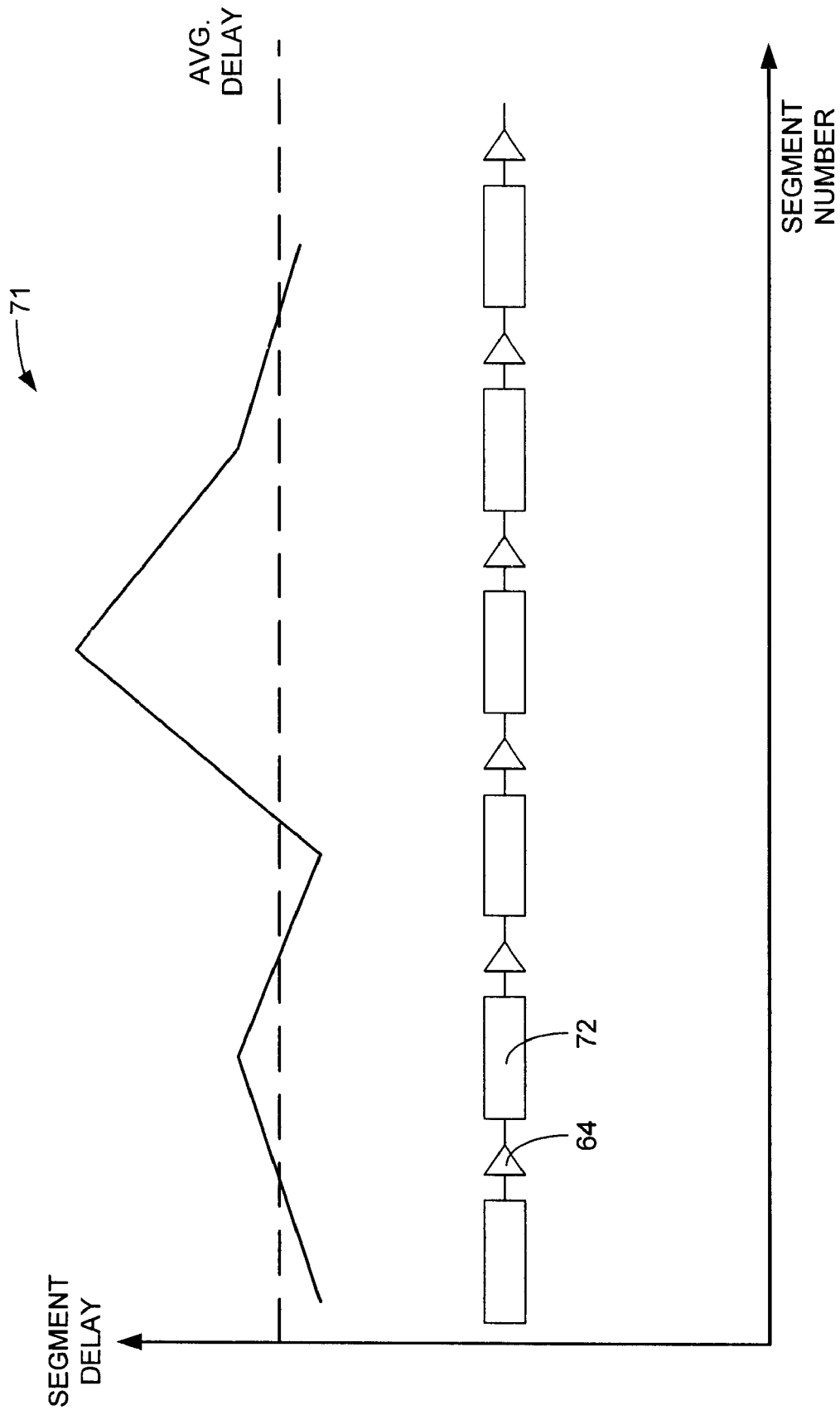
FIG. 5 is a graph (segment delay versus segment number) showing the results of implementation of a balanced segment delay algorithm, where at each iteration, the segment with the longest delay gives up some length proportionally to the segments that have a below average delay.

FIG. 5 shows the effect of the balanced segment delay algorithm. Assuming a point to point branch, at each iteration, the segment 72 (parts of netlist between consecutive repeaters 64) with the longest delay gives up some length proportionally to the segments 72 that have below average delay.

For an interconnect path with more segments of different trace width, spacing, and length, there are no analytical equations for the optimized repeater positions. Also, the optimized repeater positions may not reside exactly on the balanced segment delay points, but may indeed be near these points. Therefore, while solving for the balanced segment delay for an interconnect path, the best result with the minimum delay is saved. In each loop, a simulation is performed, and the delays on the segments are measured by using either fast delay calculators and SPICE in the first phase or SPICE in the second phase. To achieve balanced segment delay, the length of the segment with the longest delay is reduced. The reduced length is transferred to the segment with the smallest delays and a simulation is run again. This method is performed iteratively until the delay differences between the segments is less than a given threshold value or the algorithm exceeds the maximum allowable iterations specified by the user as shown in FIG. 3.

A flow chart showing an example of a possible implementation of the balanced segment delay algorithm is shown in FIG. 6. First, a branch, for example, a main branch 62 or side branch 63a–63c, is obtained, as indicated at block 72. Next, as indicate in block 73, a repeater 64 is inserted in the branch, preferably although not necessarily, approximately in the middle of the branch, to create a segment on both sides of the repeater. For example, see FIG. 4C, wherein insertion of a first repeater 64, having first and second ports 68a, 68b, along the main branch 62 creates first and second segments 69a, 69b. Referring back to FIG. 6, a simulation is performed with the repeater 64 in the branch, as denoted at block 74, using a delay simulator 15 (FIG. 1). The overall delay of the branch is stored for later analysis at the next block 75. Further, as indicated at block 76, the delays of each segment are evaluated and compared to determine which direction, if any, the repeater 64 should be moved along the branch. The repeater 64 is moved in the direction of the longest delay, as denoted at block 77. In other words, the segment having the longest delay is reduced in size as the repeater 64 encroaches upon it, while the segment having the shorter delay becomes longer as the repeater 64 is moved away from it. The foregoing steps 74–77 of branch simulation, branch delay storage, analysis of segment delays, and repeater movement, respectively, are performed iteratively until it appears that the delays on each of the two segments are equivalent within a predefined tolerance, or predefined threshold. Finally, as indicated at block 79, all of the overall branch delays that were stored during the iterative process are evaluated, and the configuration having the lowest overall branch delay is selected (which may not be the configuration which yielded balanced segment delay).

The second approach in the first phase at block 52 of FIG. 3 can use an exhaustive search algorithm and an Elmore delay calculator program (which implements the Elmore algorithm) to find optimized positions simply by investigating all possible repeater positions from a source-to-link path. The Elmore algorithm is described in detail in L. P. Ginneken, "Buffer Placement in Distributed RC-tree Networks for Minimal Elmore Delay," IBM, NY, *IEEE International Symposium on Circuits and Systems,* 1990, which is incorporated herein by reference. A brute force approach would have an $O(N^B)$ complexity where N is the number of nodes in the RC netlist and B is the number of repeaters 64 to be inserted. With the more efficient algorithm, the complexity is $O(N^2)$ independent of the number of repeaters 64 been inserted.

Next, at block 53 of FIG. 3, a determination is made as to whether the timing constraint is met. If not, then more repeaters 64 need to be added to the branch, and the process reverts back to the functionality indicated at block 52. If the timing constraint is met, then the second phase optimization process is employed, as indicated at block 55.

While in the second phase (fine tuning) of optimization, SPICE or OPTspice is used for delay calculation, while performing the balanced delay algorithm. After the position of the repeater(s) is optimized, then the repeater size(s) is optimized, as denoted at block 56.

Figure 8:
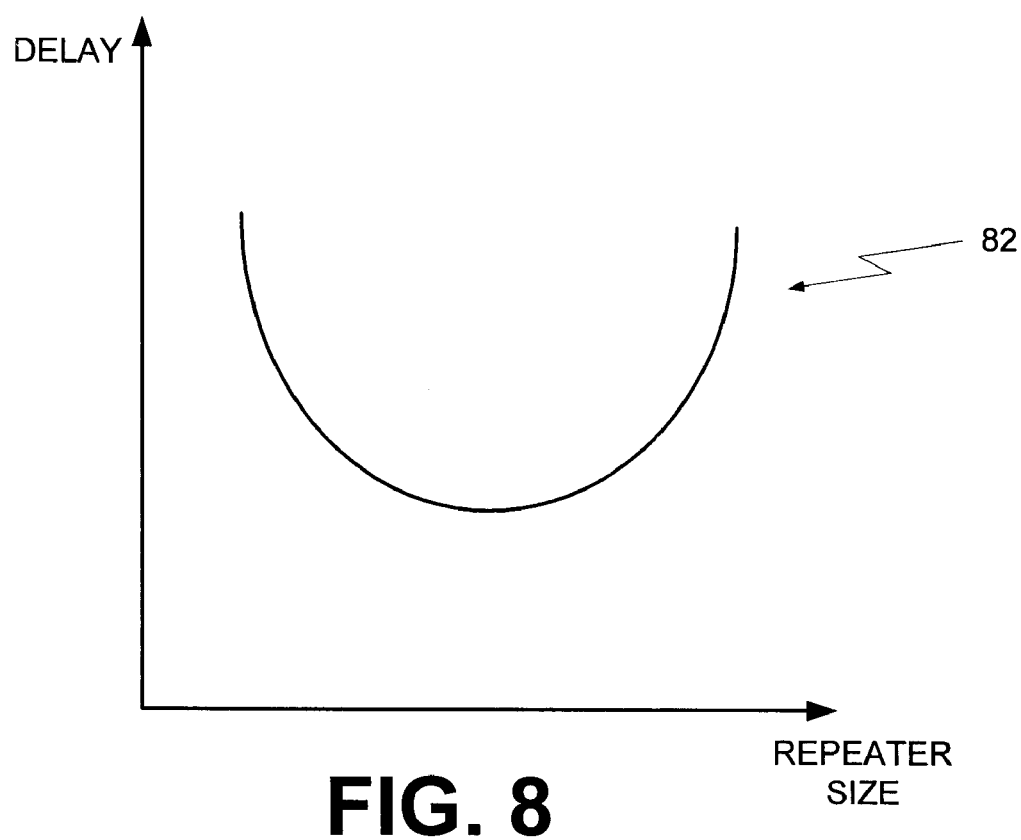
FIG. 8 is a graph showing the effect of repeater size on signal propagation delay.

As indicated at block 56, the repeaters 64 along the branch are optimized with a segmented delay algorithm and/or transition constraints using a binary search. Since maximum repeater size is used in the inserted repeaters 64 from the previous phases, the repeaters 64 can be downsized to just meet the delay and transition constraints. The delay versus repeater size exhibits a U-shaped curve 82 as shown in FIG. 8. However, in the preferred embodiment, the maximum initial repeater size is determined to always fall on the left half of the U-shaped curve 82. Downsizing a repeater 64 corresponds to moving leftward on the U-shaped curve 82.

First, consider the optimization algorithm for a single repeater. Given a set of timing and transition constraints, we are looking for the optimal repeater size, i e, the minimum channel widths while still meeting the criteria. The netlist 27 (for instance, a SPICE deck) is simulated by using the user-defined maximum repeater size. If this design does not meet the constraints, then the optimization is stopped with the result that repeater must be larger to satisfy the timing specification. If this initial simulation succeeds, a simulation is then performed with the minimum repeater size. If this size meets the constraints, then it is the optimal repeater size and the optimization is complete.

In all other cases, the optimization algorithm starts. The optimization is basically a binary search, somewhat adapted to the present problem and is performed on one parameter, the repeater size. The algorithm always works with three points representing an interval with the middle point always equidistant from the extreme points. The point with the highest repeater size (called the highest point) always meets the requirements and the lowest point never meets them; therefore, we have two different cases for the middle point. In the first case, the middle point meets the constraints. The highest point is then placed in between the lowest and the middle points. The middle point becomes the highest point. In the second case, the middle point does not meet the constraints. The lowest point is then moved in between the highest and the middle points. The first set of points are the maximum and minimum inverter sizes, which by definition, do and do not meet the constraints respectively. With each iteration, the repeater width interval is halved. The optimization routine stops when the size of the interval goes below the value set by the user.

In several dynamic drives are present in the input deck, the algorithm just described is applied to all of them simultaneously but with the corresponding timing and transition constraints. Since the repeater locations are derived from the balanced segment delay algorithm of the previous phases, the proportional delay specification can be used as a delay constraint for each stage. A stage is defined to be between the input of an inserted repeaters 64 and the input of the next inserted repeater. The corresponding delay specification for each stage can be derived from the following equation:

$$D_{StageSpec} = D_{StageReal}/D_{TotalReal} \cdot D_{TotalSpec} \qquad \text{Eq. 2}$$

where each $D_{StageReal}$=the current real delay of the stage, $D_{TotalReal}$=the current real delay of the path, $D_{TotalSpec}$=the delay specification of the path, and $D_{StageSpec}$=the proportional delay specification of the path.

The downsizing of repeaters 64 can also be formulated automatically using OPTspice to meet the total delay and transition constraints. However, the time spent in using OPTspice for repeater downsizing is usually much longer (greater the 5 times) than the aforementioned approach.

Finally, after repeater sizes are optimized, the process outputs a new netlist having the inserted repeaters 64 to memory 13, and process flow reverts back to the process of FIG. 2, particularly, to either block 44 or 45 in FIG. 2, whichever is applicable.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention.

What is claimed is:

1. A method for determining where to insert repeaters when designing an integrated circuit in order to reduce signal propagation delays in the integrated circuit, comprising the step of:

(a) obtaining a description of an electrical network, said description indicating a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said branches, each said timing constraint representing a maximum propagation time delay between said source and a respective one of said sinks;

(b) determining a slack parameter for each branch of said network, said slack parameter being computed for each branch by mathematically subtracting a signal propagation delay associated said each branch from a timing constraint associated with said each branch;

(c) determining a main branch in said network as one of said branches that exhibits the largest one of said slack parameters;

(d) producing a total slack parameter by mathematically combining said slack parameters;

(e) determining how many of said repeaters, if any, should be inserted in at least one side branch extending from said main branch by simulating at least one repeater in at least one side branch and determining whether said total slack parameter decreases by insertion of said at least one repeater;

(f) determining how many of said other repeaters, if any, should be inserted along said main branch using a first delay simulator and simulating at least one other repeater; and (g) determining a position for each of said other repeaters using a second delay simulator and simulating said other repeaters.

2. The method of claim 1, further comprising the steps of:

(h) determining how many more of said repeaters, if any, should be inserted in said side branches using said first delay simulator and simulating at least one of said more repeaters; and (i) determining a position for each of said more repeaters using a second delay simulator and simulating said more repeaters.

3. The method of claim 1, wherein said repeater comprises at least one CMOSFET inverter.

4. The method of claim 1, wherein said first delay simulator uses either a balanced segment delay process or an exhaustive search process and wherein said second delay simulator uses a balanced segment delay process.

5. A method for determining where to insert repeaters when designing an integrated circuit in order to reduce signal propagation delays in the integrated circuit, comprising the step of:

(a) obtaining a description of an electrical network;

(b) simulating said description to obtain signal propagation delays associated with respective branches of said network;

(c) determining a main branch in said network based upon signal propagation delays by determining a slack parameter for each branch of said network, said slack parameter being computed for each branch by mathematically combining a signal propagation delay associated said each branch with a timing constraint associated with said each branch, and identifying said main branch as the one of said branches that exhibits the largest one of said slack parameters;

(d) simulating at least one repeater in at least one side branch extending from said main branch;

(e) determining whether said at least one repeater should be inserted, where simulated, based upon said signal propagation delays associated with said branches;

(f) simulating at least one other repeater along said main branch;

(g) determining whether said at least one other repeater should be inserted, where simulated, based upon said signal propagation delays associated with said branches;

(h) simulating at least one more repeater in at least one side branch extending from said main branch; and (i) determining whether said at least one other repeater should be inserted, where simulated, based upon said signal propagation delays associated with said branches.

6. The method of claim 5, wherein said description indicates a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing said signal propagation delays from said source to each said sink and said timing constraints.

7. The method of claim 5, further comprising the step of outputting information pertaining to repeater locations and connectivity.

8. The method of claim 5, further comprising the steps of:
determining a slack parameter for each branch of said network before and after insertion and simulation of said at least one repeater, said slack parameter being computed for each branch by mathematically combining a signal propagation delay associated said each branch and a timing constraint associated with said each branch;
producing first and second total slack parameters by mathematically combining said slack parameters before and after said insertion and simulation; and
determining whether said at least one repeater should be inserted, where simulated, based upon whether said total slack parameter decreases with insertion of said at least one repeater.

9. The method of claim 5, wherein step (g), step (i), or both, comprise the steps of:
performing a first phase optimization to determine a number of repeaters to be inserted along the respective branch using a first delay simulator; and
performing a second phase optimization to determine a position for each of said number of repeaters using a second delay simulator that is different than said first delay simulator.

10. The method of claim 9, wherein said first delay simulator uses either a balanced segment delay process or an exhaustive search process and wherein said second delay simulator uses a balanced segment delay process.

11. The method of claim 5, wherein said repeater comprises at least one CMOSFET inverter.

12. A method for determining where to insert repeaters when designing an integrated circuit in order to reduce signal propagation delays in the integrated circuit, comprising the step of:
(a) obtaining a description of an electrical network;
(b) simulating said description to obtain signal propagation delays associated with respective branches of said network;
(c) determining a main branch in said network based upon signal propagation delays;
(d) simulating at least one repeater in at least one side branch extending from said main branch;
(e) determining whether said at least one repeater should be inserted, where simulated, based upon said signal propagation delays associated with said branches;
(f) simulating at least one other repeater along said main branch;
(g) determining whether said at least one other repeater should be inserted, where simulated, based upon said signal propagation delays associated with said branches;
(h) simulating at least one more repeater in at least one side branch extending from said main branch;
(i) determining whether said at least one other repeater should be inserted, where simulated, based upon said signal propagation delays associated with said branches;
(j) determining a slack parameter for each branch of said network before and after insertion and simulation of said at least one repeater, said slack parameter being computed for each branch by mathematically combining a signal propagation delay associated said each branch and a timing constraint associated with said each branch;
(k) producing first and second total slack parameters by mathematically combining said slack parameters before and after said insertion and simulation; and
(l) determining whether said at least one repeater should be inserted, where simulated, based upon whether said total slack parameter decreases with insertion of said at least one repeater.

13. The method of claim 12, wherein said description indicates a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing said signal propagation delays from said source to each said sink and said timing constraints.

14. The method of claim 12, wherein step (c) comprises the steps of:
determining a slack parameter for each branch of said network, said slack parameter being computed for each branch by mathematically combining a signal propagation delay associated said each branch with a timing constraint associated with said each branch; and
identifying said main branch as the one of said branches that exhibits the largest one of said slack parameters.

15. The method of claim 12, further comprising the step of outputting information pertaining to repeater locations and connectivity.

16. The method of claim 12, wherein step (g), step (i), or both, comprise the steps of:
performing a first phase optimization to determine a number of repeaters to be inserted along the respective branch using a first delay simulator; and
performing a second phase optimization to determine a position for each of said number of repeaters using a second delay simulator that is different than said first delay simulator.

17. The method of claim 16, wherein said first delay simulator uses either a balanced segment delay process or an exhaustive search process and wherein said second delay simulator uses a balanced segment delay process.

18. The method of claim 12, wherein said repeater comprises at least one CMOSFET inverter.

19. A method for determining where to insert repeaters when designing an integrated circuit in order to reduce signal propagation delays in the integrated circuit, comprising the step of:

(a) obtaining a description of an electrical network;

(b) simulating said description to obtain signal propagation delays associated with respective branches of said network;

(c) determining a main branch in said network based upon signal propagation delays;

(d) simulating at least one repeater in at least one side branch extending from said main branch;

(e) determining whether said at least one repeater should be inserted, where simulated, based upon said signal propagation delays associated with said branches;

(f) simulating at least one other repeater along said main branch;

(g) determining whether said at least one other repeater should be inserted, where simulated, based upon said signal propagation delays associated with said branches;

(h) simulating at least one more repeater in at least one side branch extending from said main branch; and (i) determining whether said at least one other repeater should be inserted, where simulated, based upon said signal-propagation delays associated with said branches, wherein step (g), step (i), or both, comprise the steps of:

performing a first phase optimization to determine a number of repeaters to be inserted along the respective branch using a first delay simulator, wherein said first delay simulator uses either a balanced segment delay process or an exhaustive search process; and performing a second phase optimization to determine a position for each of said number of repeaters using a second delay simulator that is different than said first delay simulator wherein said second delay simulator uses a balanced segment delay process.

20. The method of claim 19, wherein said description indicates a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing said signal propagation delays from said source to each said sink and said timing constraints.

21. The method of claim 19, wherein step (c) comprises the steps of:

determining a slack parameter for each branch of said network, said slack parameter being computed for each branch by mathematically combining a signal propagation delay associated said each branch with a timing constraint associated with said each branch; and identifying said main branch as the one of said branches that exhibits the largest one of said slack parameters.

22. The method of claim 19, further comprising the step of outputting information pertaining to repeater locations and connectivity.

23. The method of claim 19, further comprising the steps of:

determining a slack parameter for each branch of said network before and after insertion and simulation of said at least one repeater, said slack parameter being computed for each branch by mathematically combining a signal propagation delay associated said each branch and a timing constraint associated with said each branch;

producing first and second total slack parameters by mathematically combining said slack parameters before and after said insertion and simulation; and determining whether said at least one repeater should be inserted, where simulated, based upon whether said total slack parameter decreases with insertion of said at least one repeater.

24. The method of claim 19, wherein said repeater comprises at least one CMOSFET inverter.

25. A balanced segment delay method for optimizing speed associated with a branch of a circuit, comprising the steps of:

(a) obtaining a description of a branch;

(b) inserting a repeater in said branch to create a configuration having first and second segments of said branch that are connected to respective first and second ports of said repeater;

(c) simulating said configuration to determine first and second segment delays for said first and second segments respectively and an overall branch delay for said branch;

(d) storing said overall branch delay;

(e) determining which direction said repeater will be moved along said branch based upon said first and second segment delays;

(f) moving said repeater in said configuration to reduce the size of one of said first and second segments, while increasing the size of the other one or said first and second segments;

(g) repeating steps (c) through (f) until said first and second segment delays are equal within a predefined threshold; and (h) selecting a particular one of said configurations that exhibits a lowest overall branch delay, wherein said branch is a main branch and, prior to steps (b) through (h), performing the steps of: placing a repeater in a side branch extending from the main branch to shield the main branch from side branch capacitance, thereby reducing delay between a source and sink associated with said main branch.

26. The method of claim 25, wherein said description indicates a source node, a sink node, a resistance, a capacitance, a timing constraint representing a maximum propagation time delay between said source and said sink.

27. The method of claim 25, further comprising the step of outputting a new description having a repeater location and an identification of elements to which the repeater is connected.

28. The method of claim 25, wherein said repeater comprises at least one CMOSFET inverter.

29. A system for determining where to insert repeaters when designing an integrated circuit in order to reduce signal propagation delays in the integrated circuit, comprising:

first means for receiving a description of an electrical network;

second means for determining a main branch in said network from said description based upon a simulation of said netlist to produce signal propagation delays associated with respective branches of said network, wherein said second means comprises: mean for determining a slack parameter for each branch of said network, said slack parameter being computed for each branch by mathematically combining a signal propagation delay associated said each branch with a timing constraint associated with said each branch, and means for identifying said main branch as the one of said branches that exhibits the largest one of said slack parameters;

third means for prompting simulation of at least one repeater in at least one side branch extending from said main branch;

fourth means for determining whether said at least one repeater should be inserted, where simulated, based upon said signal propagation delays associated with said branches;

fifth means for prompting simulation of at least one other repeater along said main branch;

sixth means for determining whether said at least one other repeater should be inserted, where simulated, based upon said signal propagation delays associated with said branches;

seventh means for prompting simulation of at least one more repeater in at least one side branch extending from said main branch; and eighth means for determining whether said at least one other repeater should be inserted, where simulated, based upon said signal propagation delays associated with said branches.

30. The system of claim 29, wherein said description indicates a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing signal propagation delays from said source to each said sink and said timing constraints.

31. The system of claim 29, further comprising mean for outputting information pertaining to repeater locations and connectivity of signals.

32. The system of claim 29, further comprising:

means for determining a slack parameter for each branch of said network before and after insertion and simulation of said at least one repeater, said slack parameter being computed for each branch by mathematically combining a signal propagation delay associated said each branch and a timing constraint associated with said each branch;

means for producing first and second total slack parameters by mathematically combining said slack parameters before and after said insertion and simulation; and means for determining whether said at least one repeater should be inserted, where simulated, based upon whether said total slack parameter decreases with insertion of said at least one repeater.

33. The system of claim 29, wherein said sixth means, said eighth means, or both, comprise:

means for performing a first phase optimization to determine a number of repeaters to be inserted along the respective branch using a first delay simulator; and means for performing a second phase optimization to determine a position for each of said number of repeaters using a second delay simulator.

34. The system of claim 33, wherein said first delay simulator uses either a balanced segment delay process or an exhaustive search process and wherein said second delay simulator uses a balanced segment delay process.

35. The system of claim 29, wherein said repeater comprises at least one CMOSFET inverter.

36. A system for determining where to insert repeaters when designing an integrated circuit in order to reduce signal propagation delays in the integrated circuit, comprising:

first means for receiving a description of an electrical network;

second means for determining a main branch in said network from said description based upon a simulation of said netlist to produce signal propagation delays associated with respective branches of said network;

third means for prompting simulation of at least one repeater in at least one side branch extending from said main branch;

fourth means for determining whether said at least one repeater should be inserted, where simulated, based upon said signal propagation delays associated with said branches;

fifth means for prompting simulation of at least one other repeater along said main branch;

sixth means for determining whether said at least one other repeater should be inserted, where simulated, based upon said signal propagation delays associated with said branches;

seventh means for prompting simulation of at least one more repeater in at least one side branch extending from said main branch;

eighth means for determining whether said at least one other repeater should be inserted, where simulated, based upon said signal propagation delays associated with said branches;

ninth means for determining a slack parameter for each branch of said network before and after insertion and simulation of said at least one repeater, said slack parameter being computed for each branch by mathematically combining a signal propagation delay associated said each branch and a timing constraint associated with said each branch;

tenth means for producing first and second total slack parameters by mathematically combining said slack parameters before and after said insertion and simulation; and eleventh means for determining whether said at least one repeater should be inserted, where simulated, based upon whether said total slack parameter decreases with insertion of said at least one repeater.

37. The system of claim 36, wherein said description indicates a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing signal propagation delays from said source to each said sink and said timing constraints.

38. The system of claim 36, wherein said second means comprises:

mean for determining a slack parameter for each branch of said network, said slack parameter being computed for each branch by mathematically combining a signal propagation delay associated said each branch with a timing constraint associated with said each branch; and means for identifying said main branch as the one of said branches that exhibits the largest one of said slack parameters.

39. The system of claim 36, further comprising mean for outputting information pertaining to repeater locations and connectivity of signals.

40. The system of claim 36, wherein said sixth means, said eighth means, or both, comprise:
means for performing a first phase optimization to determine a number of repeaters to be inserted along the respective branch using a first delay simulator; and
means for performing a second phase optimization to determine a position for each of said number of repeaters using a second delay simulator.

41. The system of claim 40, wherein said first delay simulator uses either a balanced segment delay process or an exhaustive search process and wherein said second delay simulator uses a balanced segment delay process.

42. The system of claim 36, wherein said repeater comprises at least one CMOSFET inverter.

43. A system for determining where to insert repeaters when designing an integrated circuit in order to reduce signal propagation delays in the integrated circuit, comprising:
first means for receiving a description of an electrical network;
second means for determining a main branch in said network from said description based upon a simulation of said netlist to produce signal propagation delays associated with respective branches of said network;
third means for prompting simulation of at least one repeater in at least one side branch extending from said main branch;
fourth means for determining whether said at least one repeater should be inserted, where simulated, based upon said signal propagation delays associated with said branches;
fifth means for prompting simulation of at least one other repeater along said main branch;
sixth means for determining whether said at least one other repeater should be inserted, where simulated, based upon said signal propagation delays associated with said branches;
seventh means for prompting simulation of at least one more repeater in at least one side branch extending from said main branch; and
eighth means for determining whether said at least one other repeater should be inserted, where simulated, based upon said signal propagation delays associated with said branches; wherein said sixth means, said eighth means, or both, comprise: means for performing a first phase optimization to determine a number of repeaters to be inserted along the respective branch using a first delay simulator, wherein said first delay simulator uses either a balanced segment delay process or an exhaustive search process, and means for performing a second phase optimization to determine a position for each of said number of repeaters using a second delay simulator wherein said second delay simulator uses a balanced segment delay process.

44. The system of claim 43, wherein said description indicates a source node, a plurality of sink nodes, a plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing signal propagation delays from said source to each said sink and said timing constraints.

45. The system of claim 43, wherein said second means comprises:
mean for determining a slack parameter for each branch of said network, said slack parameter being computed for each branch by mathematically combining a signal propagation delay associated said each branch with a timing constraint associated with said each branch; and
means for identifying said main branch as the one of said branches that exhibits the largest one of said slack parameters.

46. The system of claim 43, further comprising mean for outputting information pertaining to repeater locations and connectivity of signals.

47. The system of claim 43, further comprising:
means for determining a slack parameter for each branch of said network before and after insertion and simulation of said at least one repeater, said slack parameter being computed for each branch by mathematically combining a signal propagation delay associated said each branch and a timing constraint associated with said each branch;
means for producing first and second total slack parameters by mathematically combining said slack parameters before and after said insertion and simulation; and
means for determining whether said at least one repeater should be inserted, where simulated, based upon whether said total slack parameter decreases with insertion of said at least one repeater.

48. The system of claim 43, wherein said repeater comprises at least one CMOSFET inverter.

49. A system for optimizing speed associated with a branch of a circuit, comprising the steps of:
(a) means for obtaining a description of a branch;
(b) means for inserting a repeater in said branch to create a configuration having first and second segments of said branch that are connected to respective first and second ports of said repeater;
(c) means for simulating said configuration to determine first and second segment delays for said first and second segments respectively and an overall branch delay for said branch;
(d) means for storing said overall branch delay;
(e) means for determining which direction said repeater will be moved along said branch based upon said first and second segment delays;
(f) means for moving said repeater in said configuration to reduce the size of one of said first and second segments, while increasing the size of the other one or said first and second segments;
(g) means for causing said means (c) through (f) to operate iteratively to create and process a plurality of configurations until said first and second segment delays are equal within a predefined threshold;
(h) means for selecting a particular one of said configurations that exhibits a lowest overall branch delay, and
(i) means for placing repeater in side branches extending from said branch to shield said branch from side branch capacitance, thereby reducing delay between a source and sink associated with said branch.

50. The system of claim 49, wherein said description indicates a source node, a sink node, a resistance, a capacitance, a timing constraint representing a maximum propagation time delay between said source and said sink.

51. The system of claim 49, further comprising the step of outputting a new description having a repeater location and an identification of elements to which the repeater is connected.

52. The system of claim 49, wherein said repeater comprises at least one CMOSFET inverter.

53. A method, comprising the steps of:
   (a) obtaining a description of an electrical network, said description indicates a plurality of electrical branches including a main branch and at least one side branch;
   (b) simulating at least one repeater in at least one side branch extending from said main branch;
   (c) simulating at least one other repeater along said main branch;
   (d) determining a slack parameter for each branch of said network before and after insertion and simulation of said at least one repeater, said slack parameter being computed for each branch by mathematically combining a signal propagation delay associated said each branch and a timing constraint associated with said each branch;
   (e) producing first and second total slack parameters by mathematically combining said slack parameters before and after said insertion and simulation; and
   (f) determining whether said at least one repeater should be inserted, where simulated, based upon whether said total slack parameter decreases with insertion of said at least one repeater.

54. The method of claim 53, further comprising the steps of:
   (g) simulating said description to obtain signal propagation delays associated with respective branches of said network;
   (h) determining a main branch in said network based upon signal propagation delays;
   (i) simulating at least one repeater in at least one side branch extending from said main branch;
   (j) determining whether said at least one repeater should be inserted, where simulated, based upon said signal propagation delays associated with said branches;
   (k) simulating at least one other repeater along said main branch;
   (l) determining whether said at least one other repeater should be inserted, where simulated, based upon said signal propagation delays associated with said branches;
   (m) simulating at least one more repeater in at least one side branch extending from said main branch; and
   (n) determining whether said at least one other repeater should be inserted, where simulated, based upon said signal propagation delays associated with said branches.

55. The method of claim 54, wherein step (h) comprises the steps of:
   determining a slack parameter for each branch of said network, said slack parameter being computed for each branch by mathematically combining a signal propagation delay associated said each branch with a timing constraint associated with said each branch; and
   identifying said main branch as the one of said branches that exhibits the largest one of said slack parameters.

56. The method of claim 54, wherein step (l), step (n), or both, comprise the steps of:
   performing a first phase optimization to determine a number of repeaters to be inserted along the respective branch using a first delay simulator; and
   performing a second phase optimization to determine a position for each of said number of repeaters using a second delay simulator that is different than said first delay simulator.

57. The method of claim 56, wherein said first delay simulator uses either a balanced segment delay process or an exhaustive search process and wherein said second delay simulator uses a balanced segment delay process.

58. The method of claim 53, wherein said description indicates a source node, a plurality of sink nodes, the plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing said signal propagation delays from said source to each said sink and said timing constraints.

59. The method of claim 53, further comprising the step of outputting information pertaining to repeater locations and connectivity.

60. The method of claim 53, wherein said repeater comprises at least one CMOSFET inverter.

61. A system, comprising:
   first means for receiving a description of an electrical network, said description indicates a plurality of electrical branches including a main branch and at least one side branch;
   second means for prompting simulation of at least one repeater in at least one side branch extending from said main branch;
   third means for prompting simulation of at least one other repeater along said main branch;
   fourth means for determining a slack parameter for each branch of said network before and after insertion and simulation of said at least one repeater, said slack parameter being computed for each branch by mathematically combining a signal propagation delay associated said each branch and a timing constraint associated with said each branch;
   fifth means for producing first and second total slack parameters by mathematically combining said slack parameters before and after said insertion and simulation; and
   sixth means for determining whether said at least one repeater should be inserted, where simulated, based upon whether said total slack parameter decreases with insertion of said at least one repeater.

62. The method of claim 61, further comprising:
   seventh means for determining a main branch in said network from said description based upon a simulation of said netlist to produce signal propagation delays associated with respective branches of said network;
   eighth means for prompting simulation of at least one repeater in at least one side branch extending from said main branch;
   ninth means for determining whether said at least one repeater should be inserted, where simulated, based upon said signal propagation delays associated with said branches;

tenth means for prompting simulation of at least one other repeater along said main branch;

eleventh means for determining whether said at least one other repeater should be inserted, where simulated, based upon said signal propagation delays associated with said branches;

twelfth means for prompting simulation of at least one more repeater in at least one side branch extending from said main branch; and thirteenth means for determining whether said at least one other repeater should be inserted, where simulated, based upon said signal propagation delays associated with said branches.

63. The system of claim 62, wherein said seventh means comprises:

mean for determining a slack parameter for each branch of said network, said slack parameter being computed for each branch by mathematically combining a signal propagation delay associated said each branch with a timing constraint associated with said each branch; and means for identifying said main branch as the one of said branches that exhibits the largest one of said slack parameters.

64. The system of claim 62, wherein said eleventh means, said thirteenth means, or both, comprise:

means for performing a first phase optimization to determine a number of repeaters to be inserted along the respective branch using a first delay simulator; and means for performing a second phase optimization to determine a position for each of said number of repeaters using a second delay simulator.

65. The system of claim 64, wherein said first delay simulator uses either a balanced segment delay process or an exhaustive search process and wherein said second delay simulator uses a balanced segment delay process.

66. The system of claim 61, wherein said description indicates a source node, a plurality of sink nodes, the plurality of electrical branches connecting said source node with each said sink node, a plurality of resistances associated respectively with said branches, a plurality of capacitances associated respectively with said branches, and a plurality of timing constraints associated respectively with said sinks, each said timing constraint representing a maximum propagation time delay between said source and a respective one of said sinks; and wherein said main branch is determined based upon analyzing signal propagation delays from said source to each said sink and said timing constraints.

67. The system of claim 61, further comprising mean for outputting information pertaining to repeater locations and connectivity of signals.

68. The system of claim 61, wherein said repeater comprises at least one CMOSFET inverter.

* * * * *